United States Patent [19]
Belkhale et al.

[11] Patent Number: 5,991,524
[45] Date of Patent: Nov. 23, 1999

[54] CLUSTER DETERMINATION FOR CIRCUIT IMPLEMENTATION

[75] Inventors: Krishna Belkhale, Campbell, Calif.; Sumit Roy, Evanston, Ill.; Devadas Varma, Fremont, Calif.

[73] Assignee: Cadence Design Systems, San Jose, Calif.

[21] Appl. No.: 08/835,947

[22] Filed: Apr. 14, 1997

[51] Int. Cl.⁶ .................................................. G06F 17/50
[52] U.S. Cl. ................................ 395/500.19; 395/500.18
[58] Field of Search ..................................... 364/488–491, 364/578; 395/500.02–500.19

[56] References Cited

U.S. PATENT DOCUMENTS

| | | | |
|---|---|---|---|
| 5,500,808 | 3/1996 | Wang | 364/578 |
| 5,521,835 | 5/1996 | Trimberger | 364/489 |
| 5,526,276 | 6/1996 | Cox et al. | 364/489 |
| 5,801,957 | 9/1998 | Lehman et al. | 364/489 |

OTHER PUBLICATIONS

Karayiannis et al. ("A new approach for clustering network modules for delay minimization", IEEE Proceedings of the 1995 International Symposium and Workshop on Systems Engineering of Computer Based Systems, pp. 325–332, Mar. 6, 1995).

Bahar et al. ("Boolean techniques for low power driven re–synthesis", IEEE/ACM International Conference on Computer–Aided Design, Nov. 5, 1995, pp. 428–432.

Kanecko et al. ("Concurrent cell generation and mapping for CMOS logic circuits", Proceedings of the ASP–DAC '97 Asia and South Pacific Design Automation Conference, Jan. 28, 1997, pp. 247–252).

De Micheli et al. ("Technology mapping of digital circuits", Proceedings of the 5th Annual European Computer Conference on Advanced Computer Technology, Reliable Systems and Applications, May 13, 1991, pp. 580–586).

Liem et al. ("A constructive matching algorithm for cell generator based technology mapping", IEEE International Symposium on Circuits and Systems, vol. 6, May 3, 1992).

Ortiz et al. ("Technology mapping algorithms for NORA dynamic logic circuits", Proceedings of 4th European Conference on Design Automation, Feb. 22, 1993, pp. 310–314).

G. Hachtel and F. Somenzi, "Logic Synthesis and Verification Algorithms", Kluwer Academic Publishers, 1996.

G. De Micheli, "Systhesis and Optimization of Digital Circuit", McGraw–Hill, Inc., 1994.

J. Mohnke and S. Malik, "Limits of Using Signatures for Permutation Independent Boolean Comparison", Proceedings of the ASP–DAC'95/CHDL'95/VLSI'95 Asia and South Pacific Design Automation Conference, Aug. 29–Sep. 1, 1995.

(List continued on next page.)

*Primary Examiner*—Eric W. Stamber
*Assistant Examiner*—Phallaka Kik
*Attorney, Agent, or Firm*—Michael A. Glenn

[57] ABSTRACT

Provided are a method, article of manufacture, and apparatus for identifying candidate clusters for matching to cells in a technology library. An automated design system comprises a computer configured to extract a portion of a circuit, levelize it, select a first node, identify the realizable clusters at the inputs of the first node, and combine the first node with realizable clusters at the inputs to produce candidate clusters. A dummy cluster is used at each input to represent using the input as a fanin. The system takes the cross product of the sets, and the first node is merged with each element of the cross product to produce a set of candidate clusters. The candidate clusters are then checked for realizability by comparing them to cells in the technology library, which includes dummy cells to facilitate mapping to large cells in the technology library. A set of realizable clusters is produced for the first node. The system applies the same process to successive nodes in the levelized circuit, including in the intermediate set the sets of realizable clusters for preceding nodes.

4 Claims, 11 Drawing Sheets

OTHER PUBLICATIONS

R. Bryant, "Graph–Based Algorithms for Boolean Function Manipulation", IEEE Transactions on Computers, vol. C–35, No. 8 p. 670, Aug. 1986.

I. Pomeranz and S. Reddy, "on Diagnosis and Correction of Design Errors", IEEE/ACM International Conference on Computer–Aided Design, Nov. 7–11, 1993.

Y. Lai, S. Sastry, and M. Pedram, "Boollean Matching using Binary Decision Diagrams with Applications to Logic Synthesis and Verification", 1992 IEEE International Conference on Computer Design: VLSI in Computers & Processors, Oct. 11–14, 1992.

E. Clarke, et al., "Spectral Transforms for Large Boolean Functions with Applications to Technology Mapping", 30th Design Automation Conference, Jun. 14–18, 1993, Dallas, Texas.

F. Mailhot and G. De Micheli, "Technology Mapping Using Boolean Matching and Don't Care Sets", Proceedings of the European Conference on Design Automation, 1990, p. 212–216.

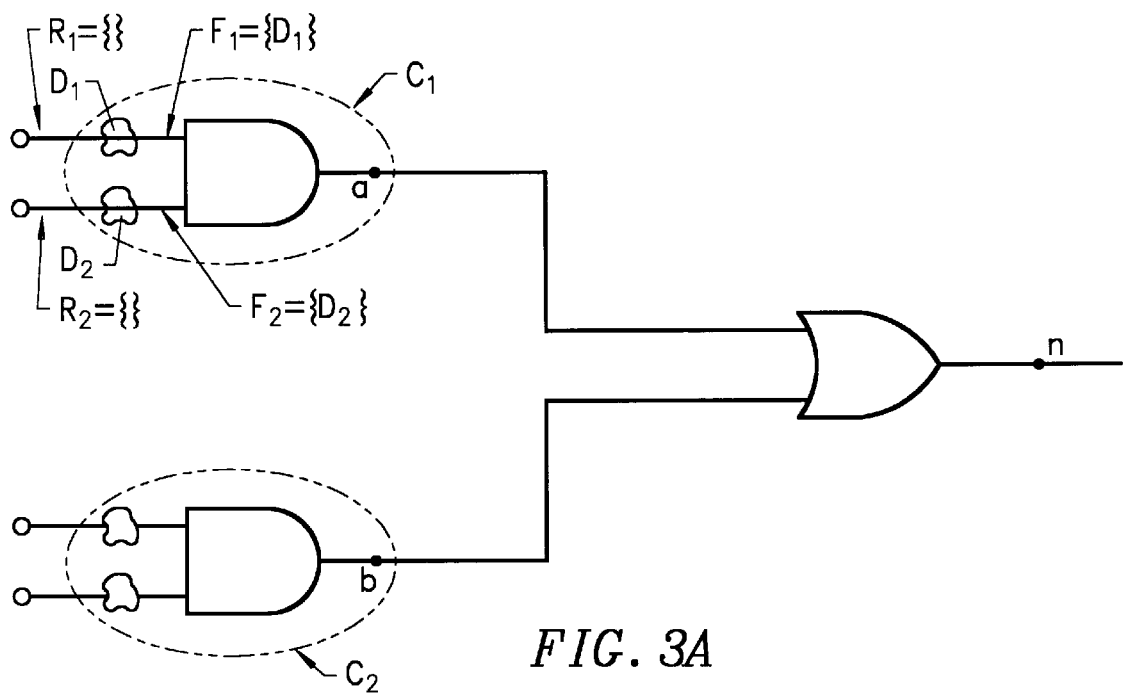
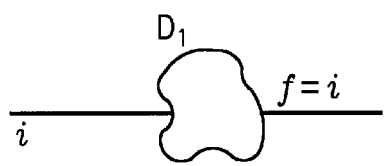
FIG. 3B
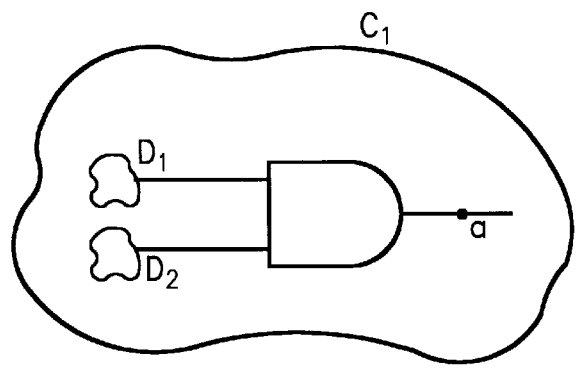
FIG. 3C
FIG. 3A

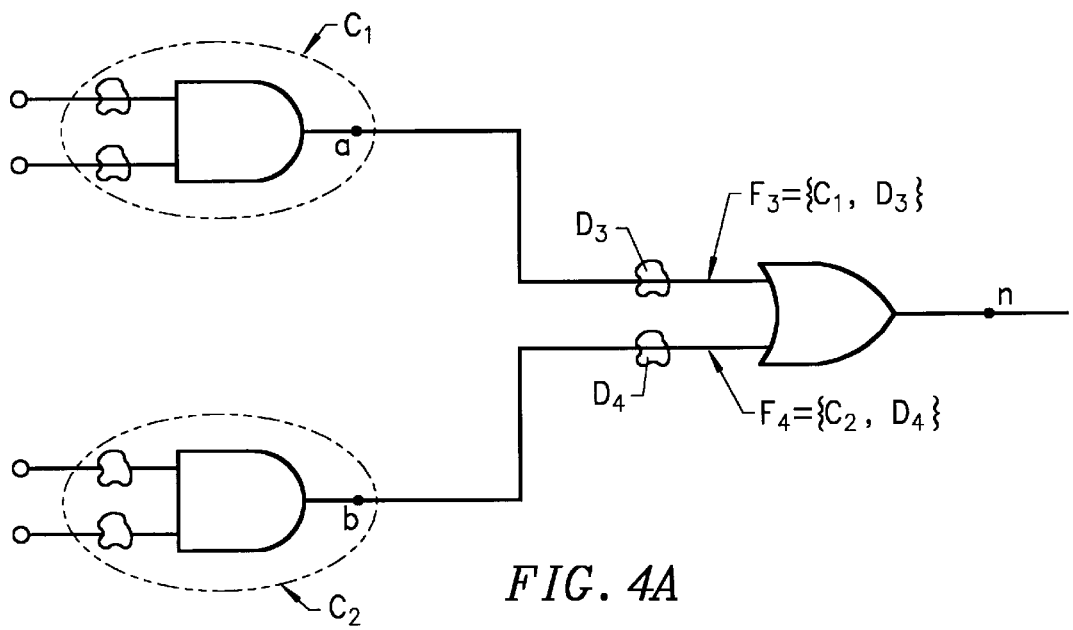
*FIG. 4A*
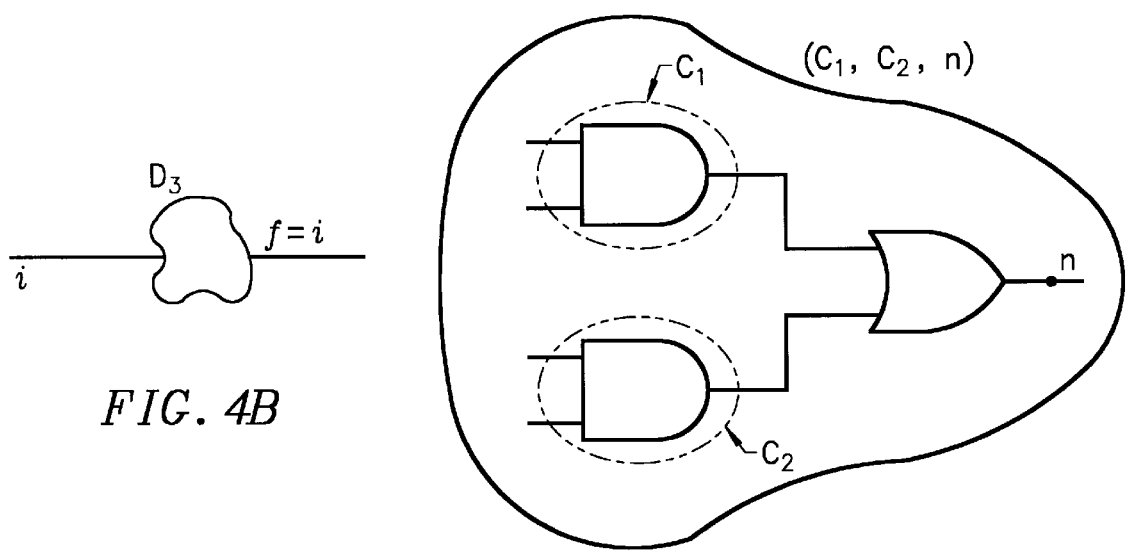
*FIG. 4B*
*FIG. 4C*

Library Cells

| Cell | Inputs | Function |
|---|---|---|
| INV | a | !a |
| AND | a, b | a & b |
| NOR | a, b | !a & ! b |
| AO1 | a, b, c | !(a & (b \| c)) |
| AO2 | a, b, c, d | (a \| b) & (c \| d) |

*FIG. 8B*

CLUSTER DETERMINATION FOR CIRCUIT IMPLEMENTATION

TECHNICAL FIELD

This invention relates to a method, article of manufacture, and apparatus for logic synthesis and mapping a technology-independent network to a technology-dependent network in the design of integrated circuits. More particularly, this invention relates to identifying portions of circuits for matching to portions of circuits stored in a technology library.

BACKGROUND

In the design of integrated circuits, there is a tradeoff between competing design goals: area of the circuit, critical path delay (speed) of the circuit, testability of the circuit, and power consumption of the circuit. The rapidly growing complexity in very large scale integrated (VLSI) circuits and the sheer mass of detail in VLSI designs necessitates the use of automated synthesis tools in order to design an optimized circuit which balances all of these design constraints. Logic synthesis is described in *Logic Synthesis and Verification Algorithms*, by Gary D. Hachtel and Fabio Somenzi, and in *Synthesis and Optimization of Digital Circuits*, by Giovanni De Micheli, the disclosures of which are hereby incorporated by reference.

Automated design systems are used in converting logic designs to specific circuits in the production of application specific integrated circuits (ASICs). This typically involves mapping the logic design, called a "technology-independent circuit" (or network), into one or more logic gates in a pre-designed set of gates called a technology library. The resulting circuit may be variously called "technology-dependent", "technology-mapped", or simply "mapped".

The technology library depends on the manufacturer and the target technology selected. For example, target technologies might include CMOS (complementary metal-oxide-semiconductor), NMOS (n-type metal-oxide-semiconductor), PMOS (p-type metal-oxide-semiconductor), TTL (bipolar transistor-to-transistor logic), and ECL (emitter-coupled logic). Further differentiation among target technologies may be based on minimum feature size, resulting in, for example, a 0.25 micron CMOS technology, a 1.0 micron CMOS technology, and a 2.0 micron CMOS technology.

Initially, the logic design may be specified in the form of Boolean equations or an HDL (hardware description language) description in a language such as Verilog or VHDL (Very High Speed Integrated Circuits Hardware Description Language). The automated design system generates a technology-independent, unmapped network that is a directed graph where the vertices (nodes) represent logic gates and the edges represent the nets connecting the gate outputs to gate inputs. This technology-independent network is optimized and mapped, producing a technology-mapped network. Typically, some restructuring is performed in order to meet specified design criteria (delay times, area, etc.). This is generally a repetitive optimizing process that involves countless changes to the logic network, with many recalculations of various network parameters after each change. One such parameter is speed, which is related to the time required for a change in one of the inputs to travel through the network to produce a change in one of the outputs. Another parameter is area, which is generally related to the number of transistors required to implement a given design.

The task of technology mapping may typically be divided into two steps. In the first step, it is necessary to determine, at each node of the technology independent circuit, a set of groupings of nodes and edges having the node as the root. These groupings are called "candidate clusters". A check is then performed to determine whether each cluster is "realizable"; i.e., the cluster can be implemented by a cell from the technology library. A cluster is considered realizable if the cluster's function can be implemented by a cell in the library, either directly, or by inverting the inputs, permuting the inputs, or inverting the outputs (i.e. if the cluster's function is "NPN equivalent" to a cell in the library). Technology mapping using Boolean matching is described in Frederic Mailhot and Giovanni De Micheli, "Technology Mapping Using Boolean Matching and Don't Care Sets", Proceedings of the European Conference on Design Automation, p. 212–216 (1990), the disclosure of which is hereby incorporated by reference. In the second step, the realizable clusters are used to completely cover the technology-independent network. As stated above, this is done while attempting to meet design constraints while minimizing area to the extent possible.

Current automated design systems generally use some type of level constraint during the generation of candidate clusters. In other words, they extract from the technology-independent network all clusters which have a maximum length L with the node as the root. The length is defined as the longest path in the extracted network, and may be determined by counting the number of nodes from the root node to the end of the longest path. The maximum number of clusters that may thus be generated can be calculated exactly, and the recurrence relation is $n(L)=(n(L-1)+1)*(n(L-1)+1)$, and $N(1)=1$ For L=1, the number of clusters examined is 1. For L=2, the number of clusters examined is 4. For L=3, 4, and 5, the number of clusters examined is, respectively: 25, 676, 458329. Clearly, this computation rapidly becomes intractable for larger values of L.

Because of the explosion in the number of clusters to be examined, practical systems limit choice of L to small values. However, this reduces the number of realizable clusters found by the system at a given node. Furthermore, larger library cells are never used, because the candidate clusters generated by the system are of limited length. These limitations result in poor quality of technology mapping and inability to map to large cells, with suboptimal results.

The need exists, therefore, for more efficient candidate cluster generation for use in technology mapping.

SUMMARY OF THE INVENTION

Briefly, therefore, this invention provides for a method, article of manufacture, and apparatus for identifying candidate clusters for matching to cells in a technology library. An automated design system comprises a computer configured to extract a portion of a circuit, select a first node in the circuit, identify the realizable clusters at the inputs of the first node, and combine the first node with realizable clusters at the inputs to produce candidate clusters.

In an embodiment of the invention, an automated design system processes a circuit to be mapped to a chosen technology. The system topologically sorts the nodes in the circuit and processes them from input to output in level order fashion. The system selects a first node in the circuit and identifies the realizable clusters at the inputs of the first node, and the realizable clusters may be those determined at the nodes at the inputs. A dummy cluster is used at each input to represent using the input as a fanin, and thus each input has a set of realizable clusters that includes the dummy cluster. The system takes the cross product of the sets, and the first node is merged with each element of the cross product to produce a set of candidate clusters. The candidate clusters are then checked for realizability by comparing them to cells in the technology library.

In a further embodiment of the invention, the technology library includes dummy cells, which are unmappable to actual cells. The system uses these dummy cells to facilitate mapping to large cells in the technology library.

The advantages and further details of the present invention will become apparent to one skilled in the art from the following detailed description when taken in conjunction with the accompanying drawings.

BRIEF DESCRIPTION OF THE DRAWINGS

In the accompanying drawings:

FIG. 3(a) is a schematic of a technology-independent network illustrating an application of the invention;

FIG. 3(b) is a schematic of a dummy cluster in accordance with the invention;

FIG. 3(c) is a schematic of a candidate cluster in accordance with the invention;

FIG. 4(a) is a schematic of a technology-independent network illustrating an application of the invention;

FIG. 4(b) is a schematic of a dummy cluster in accordance with the invention;

FIG. 4(c) is a schematic of a candidate cluster in accordance with the invention;

FIG. 8(b) is a table of cells in a technology library; and

DESCRIPTION OF THE INVENTION

Figure 1:
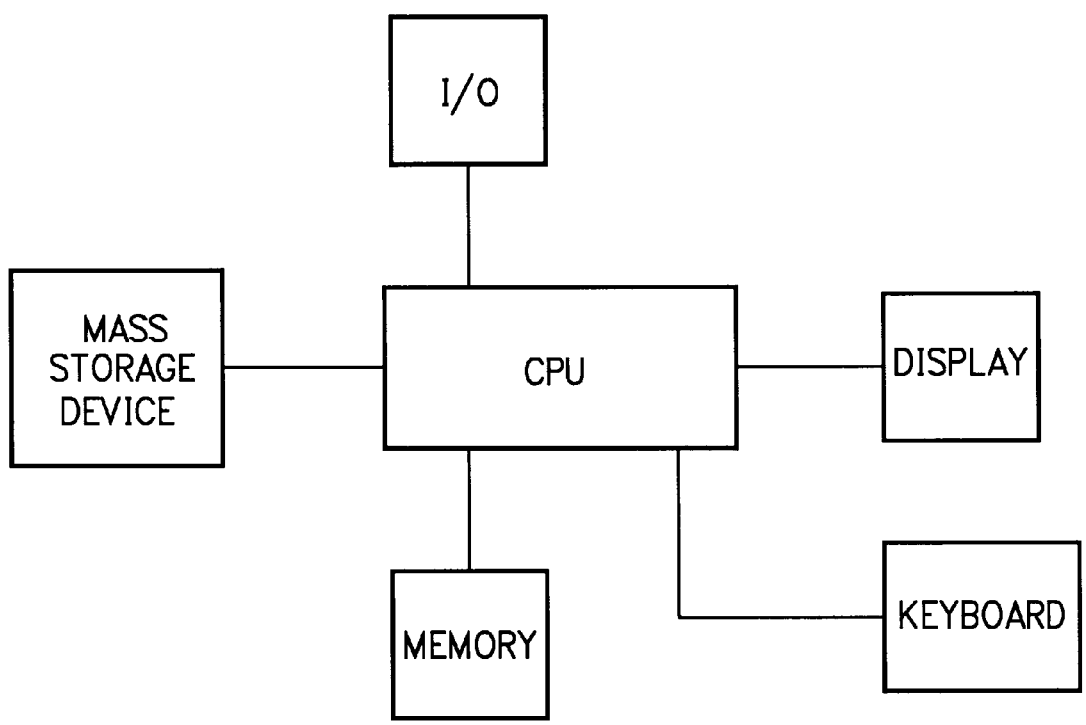
FIG. 1 is a schematic of an automated design system in accordance with the invention.

In accordance with the invention, an automated design system comprises a computer configured to convert a logic design to a specific circuit. In an embodiment of the invention, the automated design system is in the form of a software program being executed on a general-purpose computer such as a DEC Alpha or an Intel Pentium-based PC running Linux. Other means of implementing the automated design system may be used, such as a special-purpose hardwired system with instructions burned into a chip. As is usual in the industry, the computer may have memory, a display, a keyboard, a mass storage device, and other input or output devices, shown in FIG. 1. In accordance with common practice, the memory and the mass storage device can be used to store program instructions and data.

The system is configured to map the logic design into one or more logic gates from a chosen technology library. The technology library may vary depending on the manufacturer and the product line selected. For example, the target technologies may include different processes such as CMOS, NMOS, PMOS, TTL, or ECL with different minimum feature sizes, and emphasize different performance goals. One target technology may emphasize minimum area and power consumption, while another target technology emphasizes speed.

Typically, the logic design is initially provided in the form of Boolean equations or an HDL (hardware description language) description in a language such as Verilog or VHDL (Very High Speed Integrated Circuits Hardware Description Language). The automated design system converts this to a technology-independent, unmapped network that is a directed graph where the vertices represent logic gates and the edges represent the nets connecting the gate outputs to gate inputs.

Figure 2A:
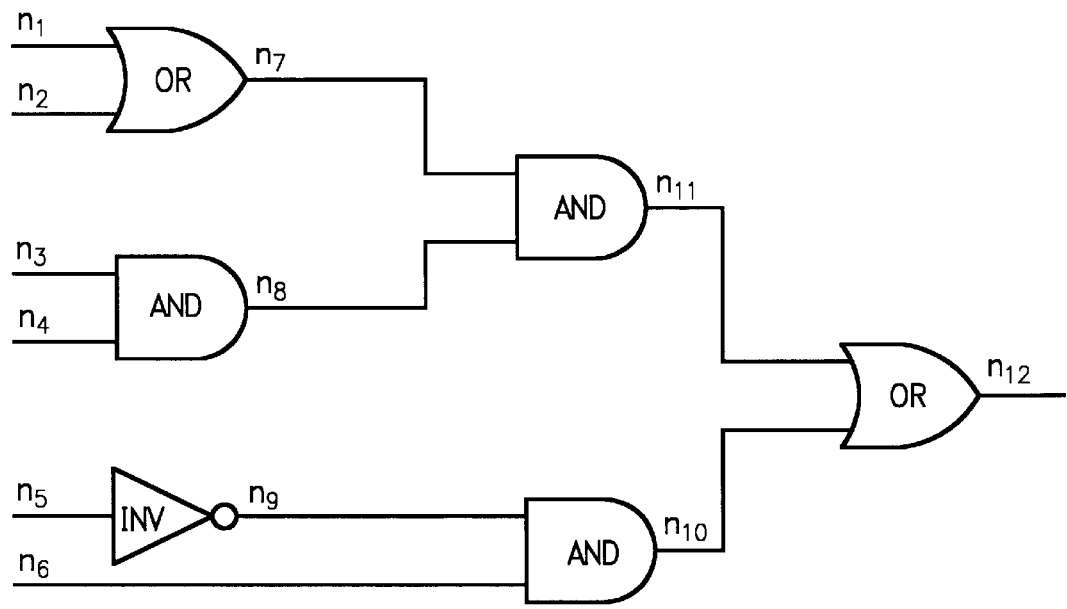
FIG. 2(a) is a schematic of a technology-independent network.
Figure 2B:
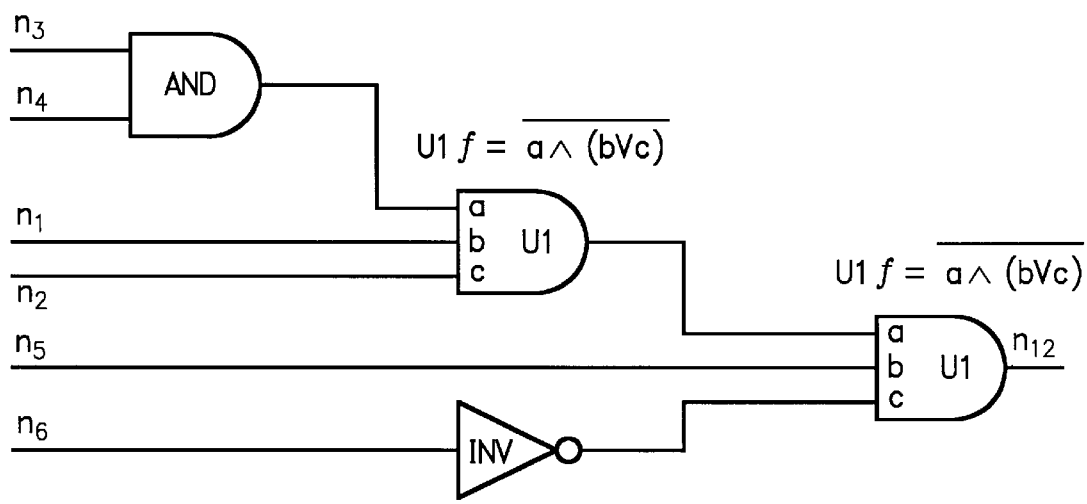
FIG. 2(b) is a schematic of a technology-dependent network equivalent to the network of FIG. 2(a)

The gates in the technology-independent network are generally primitive gates such as AND, OR, NAND, NOR, and INV gates. The gates in the technology library may include primitive gates and gates with complex combinational functions. For example, a technology-independent network as shown in FIG. 2(a) might map to the technology-dependent network shown in FIG. 2(b). The technology-dependent network uses a complex gate U1, which is a cell with three inputs A, B, and C, and has the function NOT (A AND (B OR C)). This gate might be represented in the technology library by its Boolean function in the form of a binary decision digram (BDD), which facilitates comparison with another combinational function for equality. Both networks result in the function $((n_1$ OR $n_2)$ AND $(n_3$ AND $n_4)$ OR $((NOT\ n_5)$ AND $n_6))$. Typically, the technology library also stores delay information for estimating the performance of a mapped circuit, and other information used by the automated design system.

The Verilog description corresponding to the circuit of FIG. 2(a) would be as follows:

```
module sample (n1,n2,n3,n4,n5,n6,n12);
    input n1,n2,n3,n4,n5,n6;
    output n12;
    wire n7,n8,n9,n10,n11;
    assign n7 = n1 | n2;
    assign n8 = n3 & n4;
    assign n11 = n7 & n8;
    assign n9 = !n5;
    assign n10 = n9 & n6;
    assign n12 = n11 | n10;
endmodule
```

A logic optimizer optimizes the technology-independent network, which is then mapped by a mapper to produce a technology-mapped, or technology-dependent, network. The technology mapping includes the following two steps: determine realizable clusters for each node in the technology-independent network; and choose covering cells from the technology library so that the technology-independent network is completely mapped. The first step may further be broken down into the following two substeps: generate candidate clusters; and determine which candidate clusters are realizable.

Generating candidate clusters involves determining, at each node of the technology independent network, a set of groupings of nodes and edges having the node as the root. Thus, a portion of the technology-independent network is extracted and a grouping is produced. These groupings are called "candidate clusters". To determine whether a candidate cluster is realizable, it is checked to determine whether it can be implemented by a gate in the technology library, either directly, or by inverting the inputs, permuting the inputs, or inverting the outputs. If it is realizable by inversion of the inputs or outputs or by permuting, it is called "NPN equivalent" to the matching cell in the library.

The generation of candidate clusters in accordance with the prior art, as described above, can be an intractable task for large clusters, and prior art systems must use level constraints (maximum length of the longest path in the extracted network). The generation of candidate clusters is a key bottleneck that affects the ability to efficiently map networks to a given technology. As will be described below, the novel method of the invention is not limited by the level constraints required with prior art methods, and large cells are now mappable, resulting in a more optimal technology-mapped network.

Because ASIC libraries are typically built in a continuous manner, gates with larger numbers of inputs can be thought of as gates that can be obtained by using combinations of smaller gates in the library. The system first topologically sorts the circuit so that if node a feeds node b, then node a is examined before node b. This process is referred to as "levelizing." After the circuit has been levelized, the nodes can then be processed in level order fashion (in the order into which they have been sorted), moving from the inputs of the network to the outputs of the network. All of the children of a node are processed before moving to another node at the same level. Thus, when a node is processed, the set of realizable clusters has already been computed at all the nodes in the transitive fanin of the node, including the nodes at the immediate fanin of the node being processed. The candidate clusters for the node can be computed from the realizable clusters at the immediate fanin. Following is a pseudocode description of the method:

```
procedure novelGenerateRealizableClusters( node n )
n->SetOfRealizableClusters = {}
for each input i of n
    {
        Fi = i->setOfRealizableClusters UNION dummy cluster
            representing the choice of using i as fanin.
    }
for each element (C1, C2) in F1 x F2
    {
        Get the composite cluster C consisting of C1, C2, and the
node n.
        if ( foundAMatchWithLibrary(C) )
            {
                Add C into n->SetOfRealizableClusters;
            }
    }
}
```

This method first computes the sets Fi, each of which consists of the set of realizable clusters already computed at the node at the immediate fanin of the input i (i.e. the set of realizable clusters associated with that input), plus an additional cluster representing the choice of using i as a fanin to the final cluster (the cluster that has the node n as its terminus). Then for every (C1, C2) in the cross product (also called "Cartesian product") of F1 X F2, the composite cluster C is obtained by merging C1, C2, and n. During the merging, common fanins of C1 and C2 are identified, and the combined cluster C has these fanins only represented once. The Boolean function of C is then obtained from composing the Boolean functions of C1, C2, and node n.

Figure 4D:
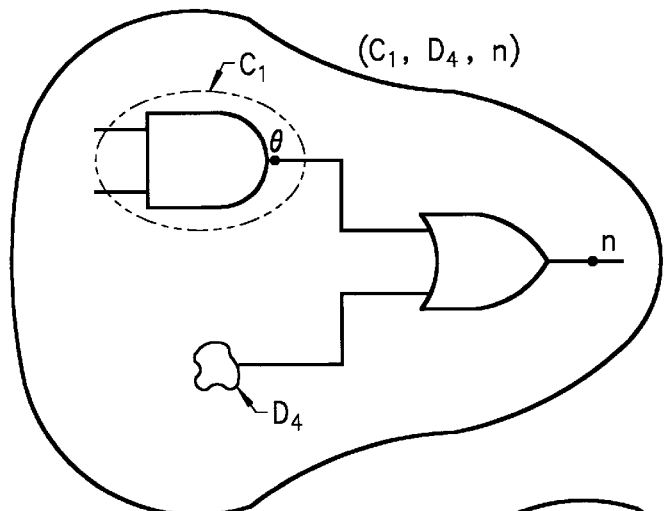
FIG. 4(d) is a schematic of another candidate cluster in accordance with the invention.
Figure 4E:
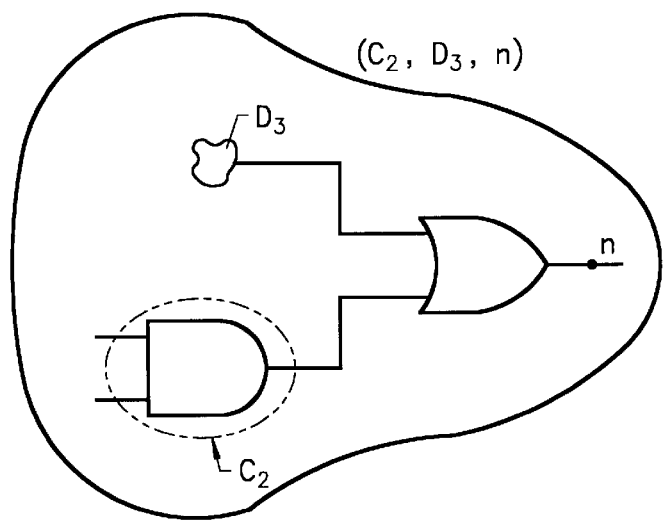
FIG. 4(e) is a schematic of another candidate cluster in accordance with the invention.
Figure 4F:
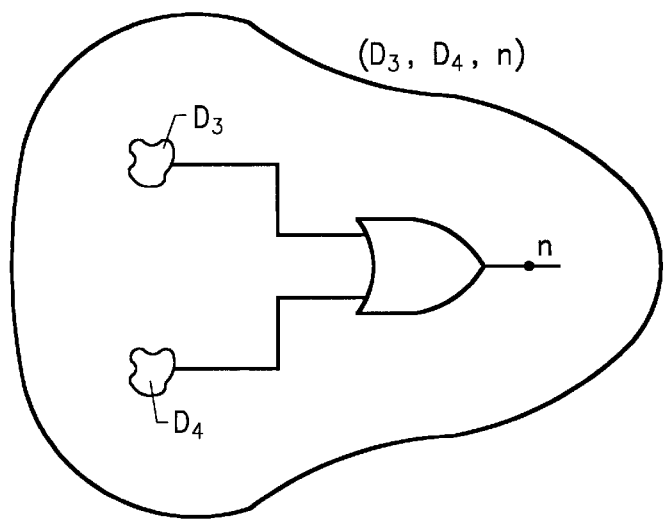
FIG. 4(f) is a schematic of another candidate cluster in accordance with the invention.

FIGS. 3–4 illustrate this method. In FIG. 3(a), the sets R1 and R1 of realizable clusters shown at the inputs of the gate are empty sets, because there is no realizable cluster that corresponds to the input line (the realizable cluster is effectively a null cluster). Dummy clusters D1 and D2 are placed at the fanin of the gate to represent the choice of using each input as the fanin, as illustrated in FIG. 3(b). Then F1=R1 UNION D1 a nd because R1 is an empty set, the result is F1={D1}. Simila rly, F2={D2}.

Taking the cross product F1 X F2 results in the set {D1, D2}, and merging with the node a produces the cluster C1={D1, D2, a}, as shown in FIG. 3(c). Thus, C1 is a candidate cluster consisting of D1, D2, and the node a. If this cluster is found in the library, it is a realizable cluster and is then stored at node a. Candidate cluster C2 may be determined similarly.

This approach is easily extended to node n, as shown in FIGS. 4(a)–(f). Dummy clusters D3 and D4 are placed at the fanin of the OR gate to represent the choice of using each input as the fanin. Applying the process above, F3=C1 UNION D3={C1, D3}. In a similar fashion, F4={C2, D4}. Taking the cross product F3 X F4 produces the set {(C1, C2), (C1, D4), (C2, D3), (D3, D4)}, and merging produces the candidate clusters (Cl, C2, n), (C1, D4, n), (C2, D3, n), and (D3, D4, n), as shown in FIGS. 4(c)–(f).

Computation time for generating the clusters with this method is significantly reduced, because the number of candidate clusters generated at a node is at most (R+1)*(R+1), where R is the maximum number of realizable clusters at a node. Realizable clusters that have been determined at a given node are used to determine candidate clusters for the node at the output of the given node. Unlike the prior art, the inventive method does not require level constraints to make it computationally tractable. Because there is no limit on the levels of the clusters, this approach results in effective mapping to large cells in the library.

To facilitate mapping of large cells in the library using the invention, the library should be built in a continuous manner.

Figure 5:
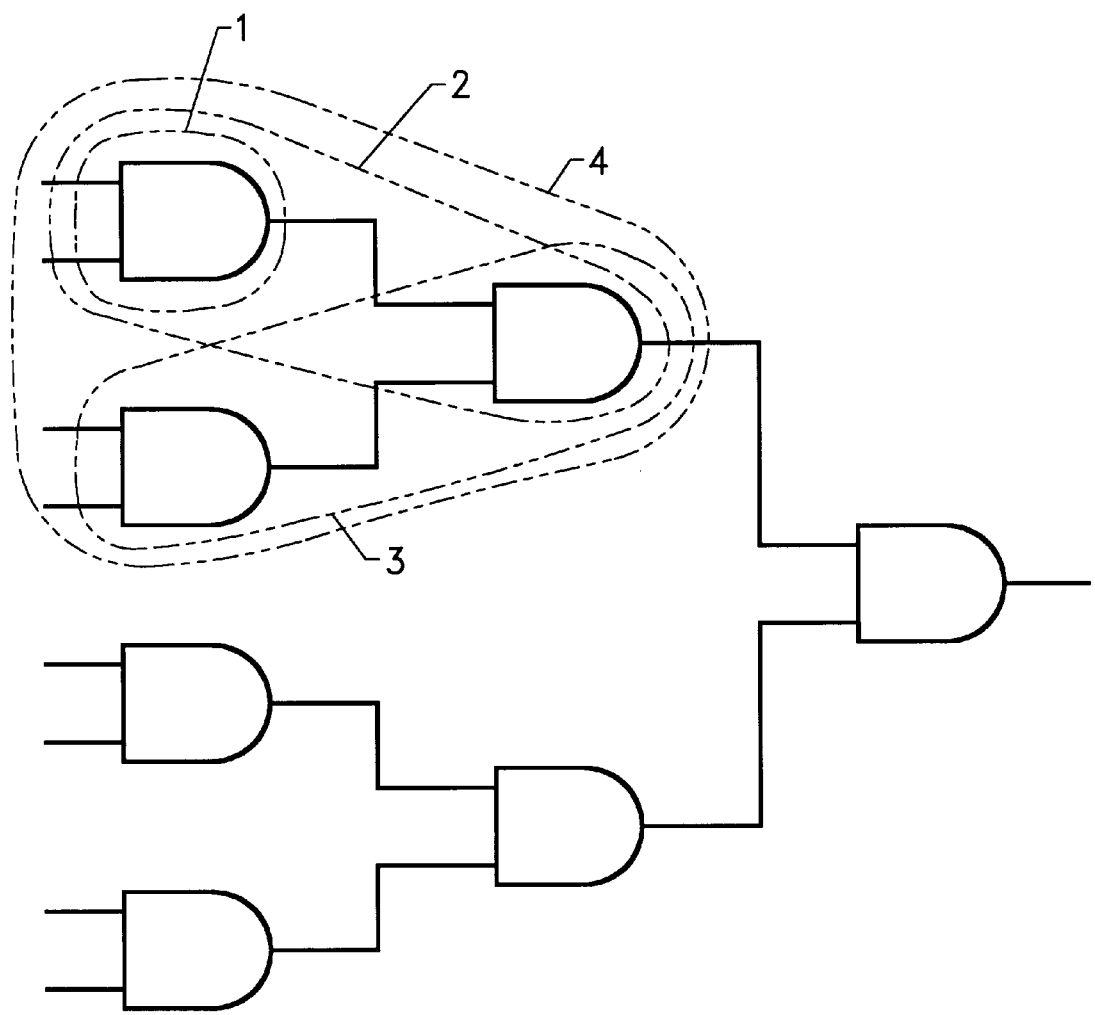
FIG. 5 is a schematic illustrating an application of the invention to an 8-input AND gate formed from cascaded 2-input AND gates.

For example, if the library has only 2-, 3-, and 8-input AND gates, the 8-input AND gate will not be mapped. This is shown in FIG. 5, which depicts an 8-input AND function built up from 2-input AND gates. (1) is realizable as a 2-input AND gate, while (2) and (3) are realizable as 3-input gates. (4), however, is not realizable because there are no 4-input AND gates in the library. Thus circuit will not be mapped into the 8-input AND gate.

Further improvement in the performance of the invention can be achieved by placing "dummy cells" in the technology library, thus ensuring continuity in the library even when continuity is not obtained by using realizable cells. These dummy cells are not themselves mappable, and are stored in the library with information indicating that they are not mappable.

However, for the purpose of cluster generation, even though they do not map to actual cells, they are treated as realizable cells. This enables the mapper in accordance with the invention to generate larger clusters for mapping to large cells in the library.

Figure 6A:
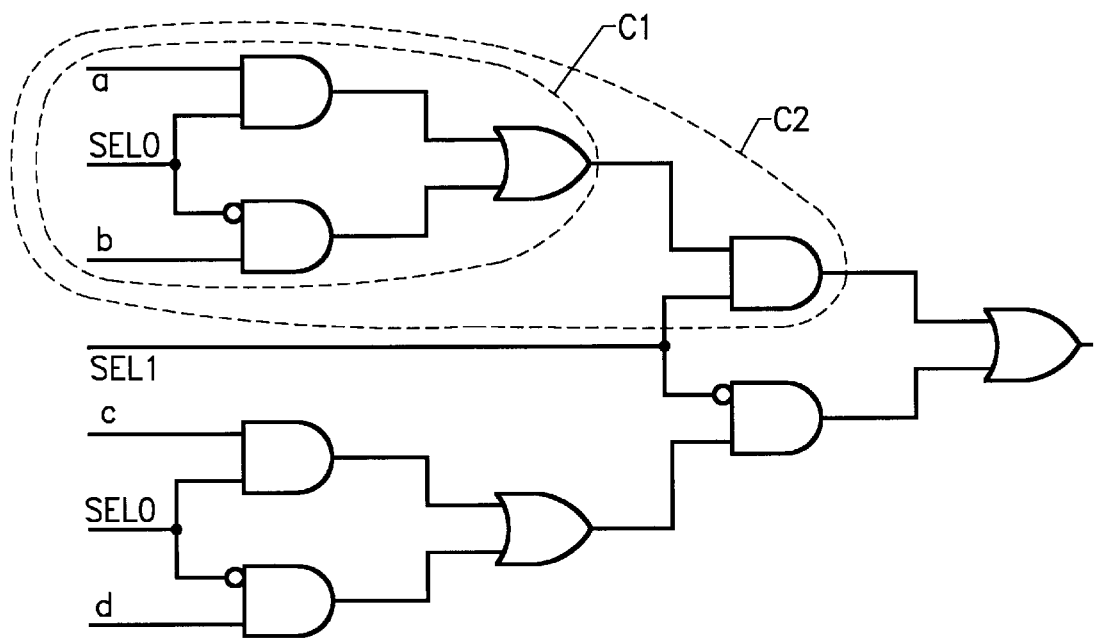
FIG. 6(a) is a schematic illustrating an application of the invention to a 4-bit multiplexer formed from cascaded 2-bit multiplexers.
Figure 6B:
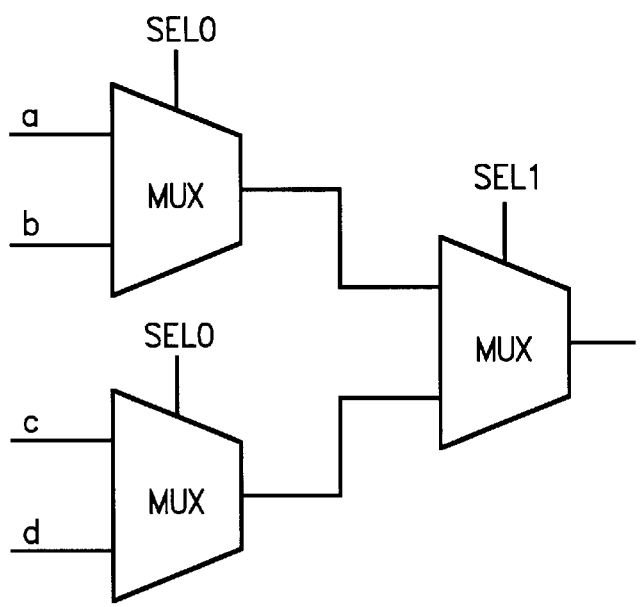
FIG. 6(b) is a schematic of a technology mapping of the network shown in FIG. 6(a)

This is illustrated by application to a multiplexer, or MUX. Consider, as shown in FIG. 6(a), a 4-bit MUX having two select lines, built from three 2-bit, one select MUXes cascaded together. FIG. 6(a) depicts cascaded MUXes at the primitive gate level. The cluster identified as C1 is realizable as a 2-bit, one select MUX. The technology library has 2-bit and 4-bit MUXes. However, the cluster identified as C2 is not realizable in the library, even though a 4-bit MUX is present in the technology library. Thus, the mapper using the cluster generation method described above may never map to the 4-bit MUX, and may map only to the three cascaded 2-bit MUXes, resulting in the mapped circuit of FIG. 6(b) shown at block level. This is due to the "hole" in the library.

Figure 6C:
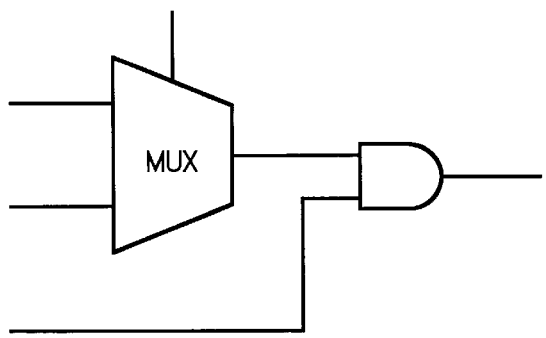
FIG. 6(c) is a schematic of a dummy cell in accordance with the invention.
Figure 6D:
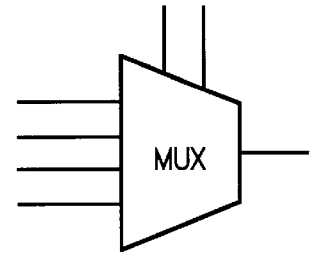
FIG. 6(d) is a schematic of another technology mapping of the network shown in FIG. 6(a)

To facilitate mapping to the 4-bit MUX, the cluster C2 may be added to the library as a dummy cell, shown in FIG. 6(c). This dummy cell is unmappable, but is present as a realizable cell for the purpose of generating clusters, and enables the mapper to produce the 4-bit MUX of FIG. 6(d). In effect, adding the dummy cell fills the hole in the library.

Figure 7A:
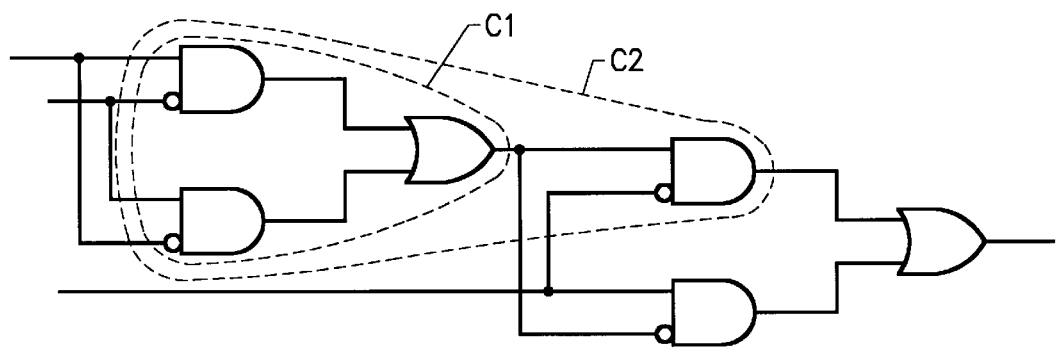
FIG. 7(a) is a schematic illustrating an application of the invention to a 3-input XOR gate formed from cascaded 2-input XOR gates.
Figure 7B:
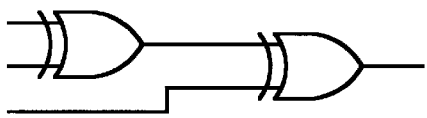
FIG. 7(b) is a schematic of a technology mapping of the network shown in FIG. 7(a)
Figure 7C:
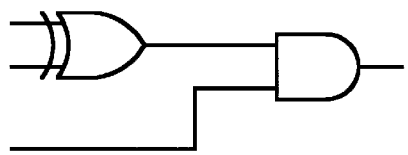
FIG. 7(c) is a schematic of a dummy cell in accordance with the invention.
Figure 7D:
FIG. 7(d) is a schematic of another technology mapping of the network shown in FIG. 7(a)

A further example of the application of dummy cells may be seen by reference to FIGS. 7(a)–(d). A pair of 2-input exclusive-OR (XOR) gates is used to produce a 3-input XOR gate. FIG. 7(a) shows the cascaded XOR gates at the primitive gate level. The cluster C1 is realizable as a 2-input XOR gate, but the cluster C2 is not realizable as a mappable cell in the library. Even with a 3-input XOR gate in the library, the mapper never maps to the 3-input XOR, and instead produces a pair of 2-input XOR gates as shown in FIG. 7(b). Addition of the dummy cell shown in FIG. 7(c) enables the mapper to map to the 3-input XOR gate shown in FIG. 7(d).

The check for realizable clusters after generating candidate clusters can be thought of as follows:

```
procedure generateRealizableClusters( node n )
n->SetOfRealizableClusters = {}
for each candidate cluster ( C ) at node n
    {
        if ( foundAMatchWithLibrary(C) )
            {
                Add C into n->SetOfRealizableClusters;
            }
    }
```

Figure 8A:
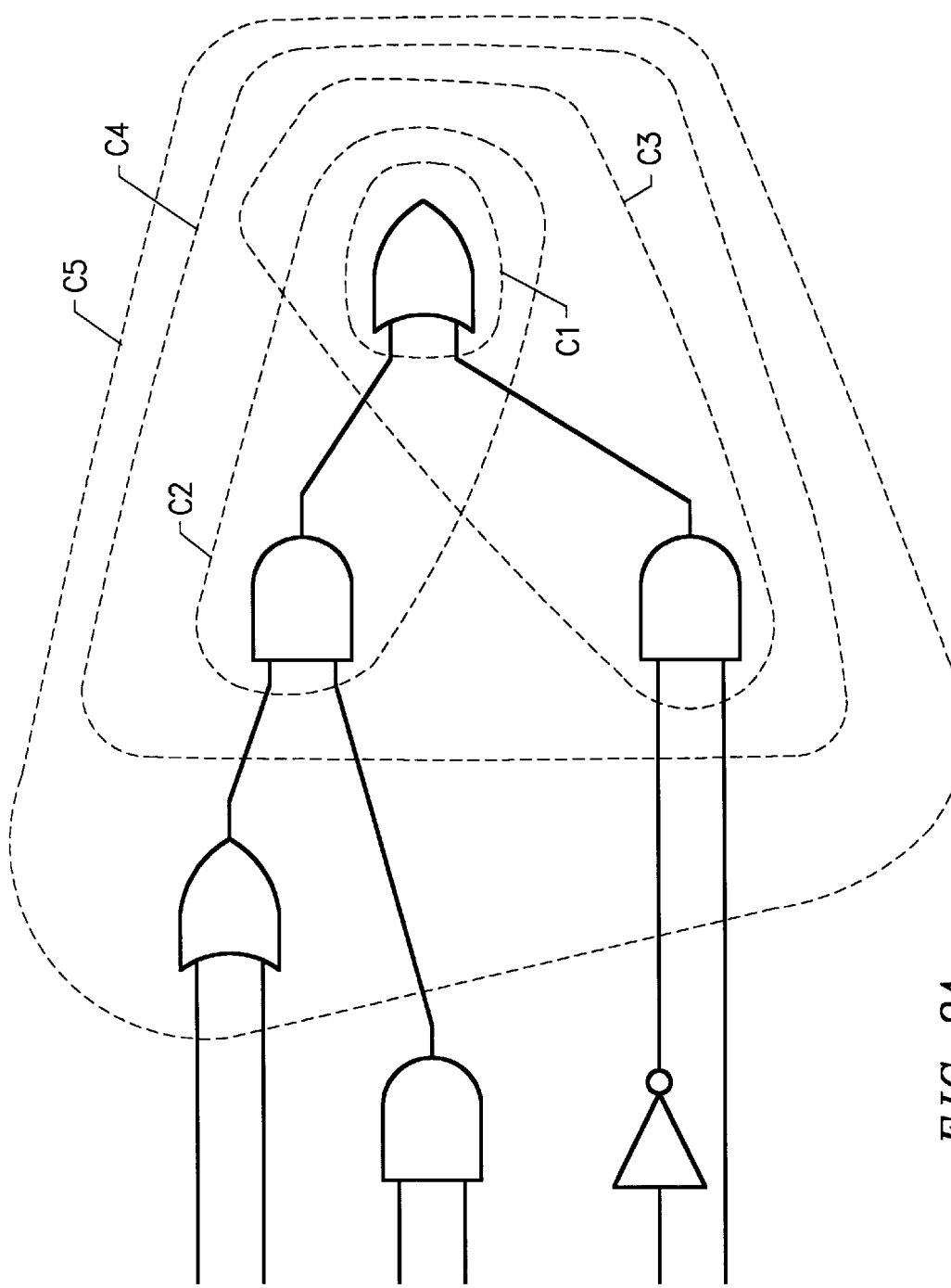
FIG. 8(a) is a schematic of a technology-independent network illustrating an application of the invention.
Figure 8C:
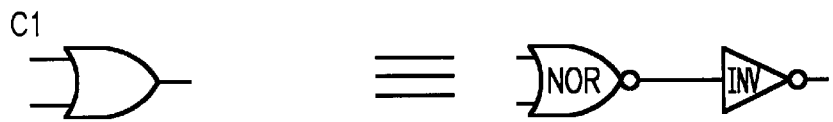
FIG. 8(c) is a schematic showing clusters found in the network of FIG. 8(a) being matched to the library cells listed in the table of FIG. 8(b).
Figure 8C:
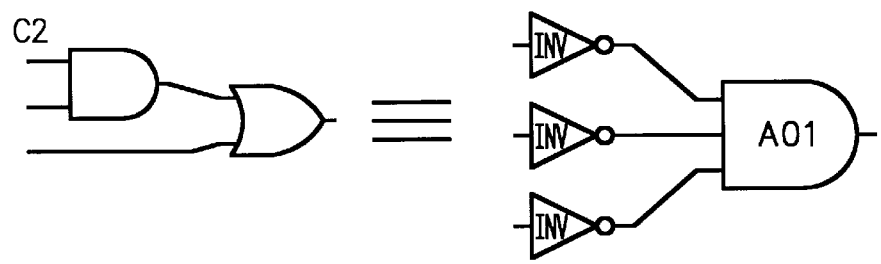
Figure 8C:
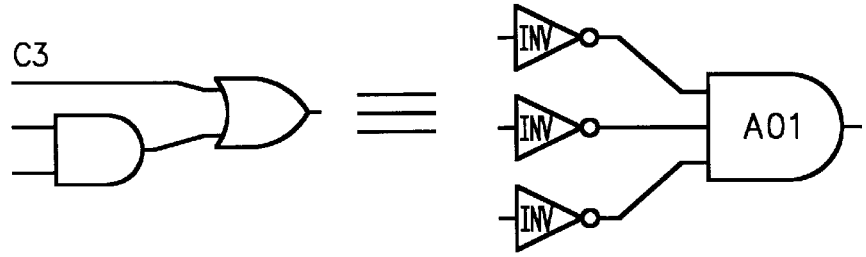
Figure 8C:
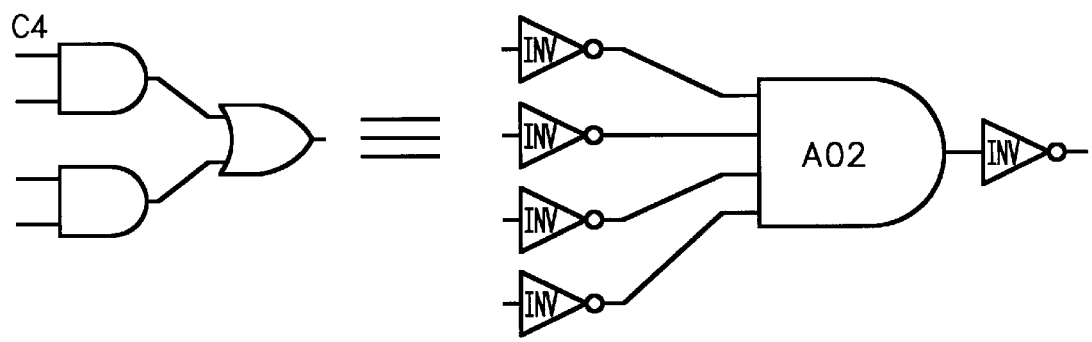

This is illustrated at FIGS. 8(a)–(c). The check for realizability is performed using a Boolean matching technique, such as those described in the references cited above. FIG. 8(a) shows the candidate clusters identified by the system and checked against the library cells shown in the table of FIG. 8(b). FIG. 8(c) illustrates the realizable clusters being matched to cells in the library. Cluster C5 is not realizable in the library and therefore no match is made.

The process can be applied to a network by working on relatively small parts of the network at a time. The system may repeatedly extract a region of the network, generate candidate clusters, check candidate clusters for realizability, select library cells to map the region, and move to another region.

The invention may thus be used to assist the automated design system in generating candidate clusters for mapping the network, and due to the reduction in computation time required for generating candidate clusters, the system is able to deal with more complex networks and larger library cells.

All references cited herein are intended to be incorporated by reference. Although the present invention has been described above in terms of a specific embodiment, it is anticipated that alterations and modifications to this invention will no doubt become apparent to those skilled in the art. It is therefore intended that the following claims be interpreted as covering all such alterations and modifications as fall within the true spirit and scope of the invention.

What is claimed is:

1. A method of generating a candidate cluster in a circuit, comprising the steps of:

topologically sorting nodes in said circuit;

processing said nodes from input to output in level order fashion;

selecting a first node in the circuit, the first node including a plurality of inputs having a set of realizable clusters associated therewith, wherein at least one of the inputs has an associated input node, and the set of realizable clusters associated with the input is associated with the input node;

defining an intermediate set including the realizable clusters, wherein the intermediate set includes a plurality of dummy clusters each associate with one of the plurality of inputs, wherein the dummy cluster represents using the input as a fanin to the first node, wherein the step of defining the intermediate set comprises taking a cross product of the sets of realizable clusters, and wherein each element of the cross product defines a cluster; and combining the first node with a cluster from the intermediate set to define the candidate cluster.

2. A method of generating a set of realizable clusters in a circuit, comprising the steps of:

selecting a first node in the circuit, the first node including a plurality of inputs, each input having a set of realizable clusters associated therewith, wherein the set of realizable clusters includes at least one unmappable cell;

defining an Intermediate set including the realizable clusters, wherein the intermediate set includes a plurality of dummy clusters, each dummy cluster being associated with one of the plurality of inputs and representing using the input as a fanin to the first node, wherein the step of defining the Intermediate set comprises including each dummy cluster in its associated set of realizable clusters, ant taking a cross product of the sets of realizable clusters, wherein each element of the cross product defines a cluster;

combining the first node with each cluster from the intermediate set to define at least one candidate cluster;

determining the realizability of the at least one candidate cluster, wherein the step of determining includes the substep of comparing the candidate cluster to at least one cell in a technology library, wherein the substep of comparing includes deriving a Boolean function of the candidate cluster and comparing it to a Boolean function of the at least one cell in the technology library;

including each realizable candidate cluster in the set of realizable clusters and providing at least one unmappable cell configured to facilitate using a cell in the library to map to a larger cell in the library; and generating a set of realizable clusters for a second node at the output of the first node, wherein the intermediate set includes the set of realizable clusters generated for the first node.

3. A method of mapping a circuit, comprising the steps of:

levelizing the circuit;

selecting a first node in the circuit, the first node including a plurality of inputs, each input having a set of realizable clusters associated therewith;

defining an intermediate set including the realizable clusters, wherein the intermediate set includes a plurality of dummy clusters, each dummy cluster being associated with one of the plurality of inputs and representing using the input as a fanin to the first node, wherein the step of defining the intermediate set comprises including each cluster in its associated set of realizable clusters, and taking a cross product of the sets of realizable clusters.

combining the first node with each cluster from the intermediate set to define at least one candidate cluster;

determining the realizability of the at least one candidate cluster, wherein the step of determining includes the substep of comparing the candidate cluster to at least one cell in a technology library;

including In the technology library at least one unmappable cell configures to facilitate using a cell in the library to map to a larger cell in the library;

including each realizable candidate cluster in the set of realizable clusters; and applying the foregoing steps to successive nodes in the levelized circuit, wherein at each successive node the intermediate set includes the set of realizable clusters generated for at least one preceding node.

4. A computer program product for generating candidate clusters in a circuit, comprising a computer usable medium having machine readable code embodied therein for performing the steps of:

selecting a first node in the circuit, the first node including a plurality of inputs, each input having a set of realizable clusters associated therewith, wherein at least one of the inputs has an associated input node, and the set of realizable clusters associated with the input is associated with the input node;

determining whether the candidate cluster is realizable and defining a set of realizable clusters associated with the first node, wherein the step of determining includes deriving a function of the candidate cluster and comparing it to a function of at least one cell in a technology library;

defining an intermediate set including the realizable clusters wherein the intermediate set includes a plurality of dummy clusters, each dummy cluster being associated with one of the plurality of inputs and representing using the input as a fanin to the first node, wherein each dummy cluster is included in its associated set of realizable clusters, and the intermediate set comprises a cross product of the sets of realizable clusters; and combining the first node with each cluster from the intermediate set to define at least one candidate cluster.

* * * * *